United States Patent
Wang

(10) Patent No.: US 10,714,650 B2
(45) Date of Patent: Jul. 14, 2020

(54) OPTICAL DETECTION CIRCUIT, OPTICAL DETECTION METHOD AND OPTICAL DETECTION DEVICE

(71) Applicant: BOE TECHNOLOGY GROUP CO., LTD., Beijing (CN)

(72) Inventor: Zhiliang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 16/121,588

(22) Filed: Sep. 4, 2018

(65) Prior Publication Data

US 2019/0296177 A1 Sep. 26, 2019

(30) Foreign Application Priority Data

Mar. 23, 2018 (CN) .......................... 2018 1 0244591

(51) Int. Cl.
*H01L 31/113* (2006.01)
*H01L 27/144* (2006.01)
(Continued)

(52) U.S. Cl.
CPC ...... *H01L 31/1136* (2013.01); *H01L 27/1443* (2013.01); *H01L 31/02019* (2013.01);
(Continued)

(58) Field of Classification Search
CPC .. H01L 31/1136; H01L 31/113; H01L 31/112; H01L 31/10; H01L 31/032;
(Continued)

(56) References Cited

U.S. PATENT DOCUMENTS

| 5,952,686 A | 9/1999 | Chou et al. |
| 2006/0016964 A1 | 1/2006 | Ogawa |

(Continued)

FOREIGN PATENT DOCUMENTS

| CN | 1734241 A | 2/2006 |
| CN | 101532874 A | 9/2009 |

(Continued)

OTHER PUBLICATIONS

First Chinese Office Action dated Nov. 5, 2019, received for corresponding Chinese Application No. 201810244591.5, 13 pages.

*Primary Examiner* — John R Lee
(74) *Attorney, Agent, or Firm* — Kinney & Lange, P.A.

(57) ABSTRACT

An optical detection circuit, an optical detection method and an optical detection device are provided. The circuit includes a photosensitive transistor, a resetting unit, an energy storing unit, a detection control unit and a detection unit. A threshold voltage of the photosensitive transistor varies with an intensity of an optical signal received by the photosensitive transistor. A wavelength of the optical signal is within a preset wavelength range. The detection control unit is configured to control the first node to be connected to the detection unit under control of a detection control terminal. The detection unit is connected to the first node via the detection control unit and is configured to, when the detection control unit controls the first node to be connected to the detection unit, detect an electric signal from the first node and obtain the intensity of the optical signal based on the electric signal.

20 Claims, 3 Drawing Sheets

(51) Int. Cl.
  H01L 31/02 (2006.01)
  H01L 31/0224 (2006.01)
  H01L 31/032 (2006.01)
  H01L 31/0376 (2006.01)
(52) U.S. Cl.
  CPC .... H01L 31/022408 (2013.01); H01L 31/032 (2013.01); H01L 31/03762 (2013.01)
(58) Field of Classification Search
  CPC ......... H01L 31/03762; H01L 31/02019; H01L 31/022408; H01L 27/1443; H01L 27/144; H01L 27/146; H01L 31/035218; G01J 1/44; G01J 2001/4473
  See application file for complete search history.

(56) References Cited

U.S. PATENT DOCUMENTS

| | | | |
|---|---|---|---|
| 2008/0164549 | A1 | 7/2008 | Takayanagi et al. |
| 2008/0179494 | A1* | 7/2008 | Tournier ........... H01L 27/14601 250/208.1 |
| 2011/0108704 | A1* | 5/2011 | Kim ..................... H04N 5/3745 250/208.1 |
| 2011/0155910 | A1 | 6/2011 | Koide |
| 2012/0138919 | A1* | 6/2012 | Lan ................... H01L 27/14609 257/43 |
| 2013/0127766 | A1* | 5/2013 | Zhao ..................... G06F 3/0412 345/173 |
| 2015/0029421 | A1* | 1/2015 | Gu .......................... G06F 3/044 349/12 |
| 2016/0211291 | A1* | 7/2016 | Kim ..................... H01L 27/142 |
| 2019/0204147 | A1* | 7/2019 | Chung ..................... G01J 1/44 |
| 2019/0296177 | A1* | 9/2019 | Wang .............. H01L 31/022408 |

FOREIGN PATENT DOCUMENTS

| | | |
|---|---|---|
| CN | 102169019 A | 8/2011 |
| CN | 103411669 A | 11/2013 |

* cited by examiner

OPTICAL DETECTION CIRCUIT, OPTICAL DETECTION METHOD AND OPTICAL DETECTION DEVICE

CROSS-REFERENCE TO RELATED APPLICATION

This application claims a priority to Chinese Patent Application No. 201810244591.5 filed on Mar. 23, 2018, the disclosure of which is incorporated in its entirety by reference herein.

TECHNICAL FIELD

The present disclosure relates to the technical field of optical detection, in particular to an optical detection circuit, an optical detection method and an optical detection device.

BACKGROUND

Optical detection circuits detecting an optical signal in a particular wavelength range are currently applied in various aspects of daily life, such as medical instruments, machinery manufacturing, cellular phones and security payment. The relevant technology fails to provide an optical detection circuit which can concisely and conveniently detect the optical signal in the particular wavelength range.

SUMMARY

In a first aspect, the present disclosure provides an optical detection circuit, including a photosensitive transistor, a resetting unit, an energy storing unit, a detection control unit and a detection unit. A first electrode of the photosensitive transistor is connected to a first node, a second electrode of the photosensitive transistor is connected to a first voltage input terminal, a gate electrode of the photosensitive transistor is connected to a gate control terminal, a threshold voltage of the photosensitive transistor changes as an intensity of an optical signal received by the photosensitive transistor changes, a wavelength of the optical signal is within a preset wavelength range, and the first voltage input terminal is configured to input a first voltage. The resetting unit is configured to control, under control of a resetting control terminal, whether the first node is connected to a second voltage input terminal or not, a first terminal of the resetting unit is connected to the first node and a second terminal of the resetting unit is connected to the second voltage input terminal, and the second voltage input terminal is configured to input a second voltage. The energy storing unit includes a first terminal connected to the first node and a second terminal connected to the second voltage input terminal. The detection control unit is configured to control, under control of a detection control terminal, whether the first node is connected to the detection unit. The detection unit is connected to the first node via the detection control unit and is configured to, in a case that the detection control unit controls the first node to be connected to the detection unit, detect an electric signal from the first node and obtain the intensity of the optical signal based on the electric signal.

Optionally, the photosensitive transistor includes a channel layer and a photosensitive material layer is arranged on a surface of the channel layer. When the photosensitive transistor is turned on, a source-drain current flowing through the channel layer changes as an intensity of an optical signal received by the photosensitive material layer changes.

Optionally, the gate electrode of the photosensitive transistor is connected to the first node. The photosensitive transistor is an n-type transistor, and the second voltage is higher than the first voltage; or, the photosensitive transistor is a p-type transistor, and the second voltage is lower than the first voltage.

Optionally, the gate electrode of the photosensitive transistor is connected to the first voltage input terminal. The photosensitive transistor is an n-type transistor, and the first voltage is higher than the second voltage; or, the photosensitive transistor is a p-type transistor, and the first voltage is lower than the second voltage.

Optionally, the energy storing unit includes a storage capacitor.

Optionally, the detection control unit includes a detection control transistor having a gate electrode connected to the detection control terminal, a first electrode connected to the first node and a second electrode connected to the detection unit.

Optionally, the resetting unit includes a resetting transistor having a gate electrode connected to the resetting control terminal, a first electrode connected to the first node, and a second electrode connected to the second voltage input terminal.

Optionally, the detection unit is configured to, in the case that the detection control unit controls the first node to be connected to the detection unit, detect a value of electric charge stored by the energy storing unit, and obtain the intensity of the optical signal based on the value of the electric charge.

Optionally, the photosensitive transistor is the p-type transistor and a difference between the first voltage and the second voltage is larger than the threshold voltage of the photosensitive transistor; or the photosensitive transistor is the n-type transistor and a difference between the first voltage and the second voltage is smaller than the threshold voltage of the photosensitive transistor.

Optionally, a detection cycle of the optical detection circuit includes a resetting phase, a sensing phase and a detecting phase that are set successively, and all transistors in the optical detection circuit are p-type transistors. The resetting control terminal outputs a high level in the resetting phase and outputs low levels in the sensing phase and the detecting phase. The detection control terminal outputs low levels in the resetting phase and the sensing phase and outputs a high level in the detecting phase.

In a second aspect, the present disclosure provides an optical detection method, applied to the above-described optical detection circuit. The optical detection method includes:

in the resetting phase, resetting, by the resetting unit under control of the resetting control terminal, a voltage at the first node to turn on the photosensitive transistor, and controlling, by the detection control unit under control of the detection control terminal, the first node to be disconnected from the detection unit;

in the sensing phase, stopping resetting the voltage at the first node by the resetting unit under control of the resetting control terminal, and enabling, by the photosensitive transistor which continues to be turned on, the energy storing unit to charge or discharge until the photosensitive transistor is turned off; and in the detecting phase, controlling, by the detection control unit under control of the detection control terminal, the first node to be connected to the detection unit, detecting, by the detection unit, an electric signal from the first node, and obtaining, by the detection unit, an intensity of the optical signal based on the electric signal.

Optionally, the gate electrode of the photosensitive transistor is connected to the first node. The step of resetting, by the resetting unit under the control of the resetting control terminal, the voltage at the first node includes: controlling, by the resetting unit under the control of the resetting control terminal, the first node to be connected to the second voltage input terminal to reset the voltage at the first node to be the second voltage. The step of enabling, by the photosensitive transistor which continues to be turned on, the energy storing unit to charge or discharge until the photosensitive transistor is turned off includes: maintaining the photosensitive transistor to be turned on and discharging, by the energy storing unit via the photosensitive transistor, until the photosensitive transistor is turned off to change the voltage at the first node into $V1+V_{th}$, where V1 is the first voltage input by the first voltage input terminal and $V_{th}$ is the threshold voltage of the photosensitive transistor.

Optionally, the gate electrode of the photosensitive transistor is connected to the first voltage input terminal. The step of resetting, by the resetting unit under the control of the resetting control terminal, the voltage at the first node includes: controlling, by the resetting unit under the control of the resetting control terminal, the first node to be connected to the second voltage input terminal to reset the voltage at the first node to be the second voltage. The step of enabling, by the photosensitive transistor which continues to be turned on, the energy storing unit to charge or discharge until the photosensitive transistor is turned off includes: enabling, by the photosensitive transistor which continues to be turned on, the energy storing unit to charge until the photosensitive transistor is turned off to change the voltage at the first node into $V1-V_{th}$, where V1 is the first voltage input by the first voltage input terminal and $V_{th}$ is the threshold voltage of the photosensitive transistor.

Optionally, the step of detecting the electric signal from the first node by the detection unit and obtaining the intensity of the optical signal based on the electric signal by the detection unit includes: detecting, by the detection unit, a value of electric charge stored in the energy storing unit and obtaining, by the detection unit, the intensity of the optical signal based on the value of the electric charge.

Optionally, the photosensitive transistor is a p-type transistor and a difference between the first voltage and the second voltage is larger than the threshold voltage of the photosensitive transistor; or the photosensitive transistor is an n-type transistor and a difference between the first voltage and the second voltage is smaller than the threshold voltage of the photosensitive transistor.

Optionally, the detection cycle of the optical detection circuit includes the resetting phase, the sensing phase and the detecting phase that are set successively, and all transistors in the optical detection circuit are p-type transistors. The resetting control terminal outputs a high level in the resetting phase and outputs low levels in the sensing phase and the detecting phase. The detection control terminal outputs low levels in the resetting phase and the sensing phase and outputs a high level in the detecting phase.

In a third aspect, the present disclosure further provides an optical detection device, including multiple above-described optical detection circuits which are arranged in an array.

DETAILED DESCRIPTION

Technical solutions in embodiments of the present disclosure are described clearly and completely in conjunction with drawings in the embodiments of the present disclosure. Apparently, described embodiments are merely a part of rather than all of embodiments of the present disclosure. All other embodiments obtained by those ordinary skilled in the art based on the embodiments of the present disclosure without paying creative efforts fall within protection scope of the present disclosure.

Figure 1:
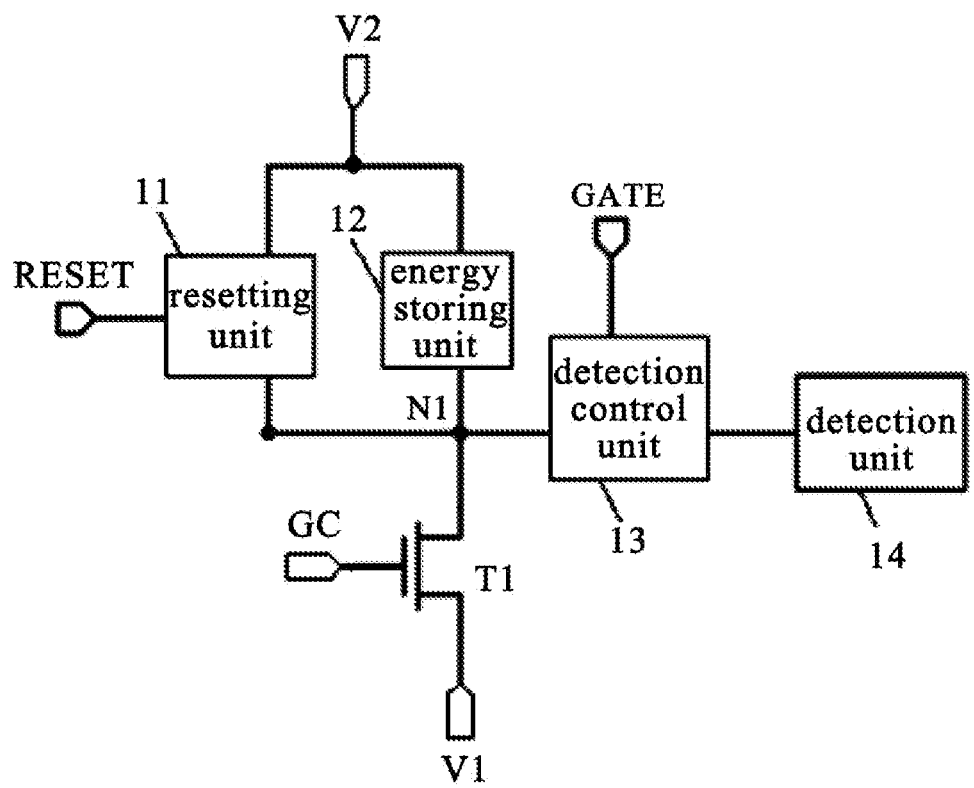
FIG. 1 is a structural diagram of an optical detection circuit according to at least one embodiment of the present disclosure.

FIG. 1 is a structural diagram of an optical detection circuit according to at least one embodiment of the present disclosure. As shown in FIG. 1, the optical detection circuit includes a photosensitive transistor T1, a resetting unit 11, an energy storing unit 12, a detection control unit 13 and a detection unit 14.

A first electrode of the photosensitive transistor T1 is connected to a first node N1, a second electrode of the photosensitive transistor T1 is connected to a first voltage input terminal, a gate electrode of the photosensitive transistor T1 is connected to a gate control terminal GC. A threshold voltage of the photosensitive transistor T1 changes as an intensity of an optical signal received by the photosensitive transistor T1 changes. A wavelength of the optical signal is within a preset wavelength range. The first voltage input terminal is configured to input a first voltage V1.

The resetting unit 11 is configured to control, under control of a resetting control terminal Reset, whether the first node N1 is connected to a second voltage input terminal or not. A first terminal of the resetting unit 11 is connected to the first node N1, and a second terminal of the resetting unit 11 is connected to the second voltage input terminal. The second voltage input terminal is configured to input a second voltage V2.

The energy storing unit 12 has a first terminal connected to the first node N1 and a second terminal connected to the second voltage input terminal.

The detection control unit 13 is configured to control, under control of a detection control terminal Gate, whether the first node N1 is connected to the detection unit 14.

The detection unit 14 is connected to the first node N1 via the detection control unit 13. The detection unit 14 is configured to, in a case that the detection control unit 13 controls the first node N1 to be connected to the detection unit 14, detect an electric signal from the first node N1, and obtain an intensity of the optical signal based on the electric signal.

In the optical detection circuit of the embodiment of the present disclosure, the threshold voltage of the photosensitive transistor changes as the intensity of the optical signal received by the photosensitive transistor changes, the wavelength of the optical signal is within the preset wavelength range, and the intensity of the optical signal can be obtained based on the electric signal from the first node and detected by the detection unit, thereby achieving photoelectric conversion.

In practical implementation, in a case that the photosensitive transistor is an n-type transistor, the threshold voltage of the photosensitive transistor is low when the photosensitive transistor receives an optical signal of high intensity, and the threshold voltage of the photosensitive transistor is high when the photosensitive transistor receives an optical signal of low intensity.

Practically, the photosensitive transistor includes a channel layer and a photosensitive material layer is arranged on a surface of the channel layer.

When the photosensitive transistor is turned on, a source-drain current flowing through the channel layer changes as an intensity of an optical signal received by the photosensitive material layer changes.

In the embodiment of the present disclosure, by arranging the photosensitive material layer on the surface of the channel layer of the photosensitive transistor, the source-drain current flowing through the channel layer changes as the intensity of the optical signal received by the photosensitive material layer changes when the photosensitive transistor is turned on, such that the threshold voltage of the photosensitive transistor changes as the intensity of the optical signal received by the photosensitive transistor changes. Here, a wavelength of the optical signal is within a preset wavelength range.

Practically, according to an optional implementation, the optical signal may be an infrared optical signal, but the present disclosure is not limited thereto.

According to another optional implementation, the optical signal may include a visible optical signal and a near-infrared optical signal, but the present disclosure is not limited thereto.

In practical, the preset wavelength range within which the wavelength of the optical signal is located may be set based on a photosensitive material selected for the photosensitive material layer arranged on the surface of the channel layer of the photosensitive transistor.

In practical, the photosensitive transistor may be an oxide thin film transistor (TFT), an amorphous silicon (a-Si) thin film transistor, or a metal-oxide-semiconductor (MOS) field effect transistor, but the present disclosure is not limited thereto. The photosensitive material layer is arranged on the surface of the channel layer of the photosensitive transistor. Due to restriction of the manufacturing process of the oxide TFT, the oxide TFT usually adopts an n-type transistor.

According to an optional embodiment, the gate electrode of the photosensitive transistor is connected to the first node, the photosensitive transistor is an n-type transistor, and the second voltage V2 is higher than the first voltage V1. Here, a difference between V2 and V1 needs to be larger than the threshold voltage of the photosensitive transistor. A specific principle is to be explained hereinafter in conjunction with a working process of a specific embodiment.

According to an optional implementation, the gate electrode of the photosensitive transistor is connected to the first node, the photosensitive transistor is a p-type transistor, and the second voltage V2 is lower than the first voltage V1. Here, a difference between V1 and V2 needs to be smaller than the threshold voltage of the photosensitive transistor. A specific principle is to be explained hereinafter in conjunction with a working process of a specific embodiment.

According to another optional implementation, the gate electrode of the photosensitive transistor is connected to the first voltage input terminal, the photosensitive transistor is an n-type transistor, and the first voltage V1 is higher than the second voltage V2. Here, a difference between V1 and V2 needs to be larger than the threshold voltage of the photosensitive transistor. A specific principle is to be explained hereinafter in conjunction with a working process of a specific embodiment.

According to another optional implementation, the gate electrode of the photosensitive transistor is connected to the first voltage input terminal, the photosensitive transistor is a p-type transistor, and the first voltage V1 is lower than the second voltage V2. Here, a difference between V2 and V1 needs to be smaller than the threshold voltage of the photosensitive transistor. A specific principle is to be explained hereinafter in conjunction with a working process of a specific embodiment.

Embodiments of the present disclosure are all described based on a case that the photosensitive transistor is the n-type transistor. In practical, the photosensitive transistor may be the p-type transistor.

In practical, the energy storing unit may include a storage capacitor. A first terminal and a second terminal of the capacitor are a first terminal and a second terminal of the energy storing unit respectively.

Specifically, the detection control unit may include a detection control transistor having a gate electrode connected to the detection control terminal, a first terminal connected to the first node, and a second terminal connected to the detection unit.

Specifically, the resetting unit is configured to control, under control of the resetting control terminal, whether the first node is connected to the second voltage input terminal. The resetting unit includes a resetting transistor having a gate electrode connected to the resetting control terminal, a first electrode connected to the first node, and a second electrode connected to the second voltage input terminal.

In practical, the detection unit is configured to, in a case that the detection control unit controls the first node to be connected to the detection unit, detect a value of electric charge stored by the energy storing unit, and obtain an intensity of the optical signal based on the value of the electric charge. That is to say, the optical signal from the first node may be an electric charge signal, the value of the electric charge read by the detection unit may represent an optical intensity of the optical signal, and the wavelength of the optical signal is located within the preset wavelength range.

Figure 2:
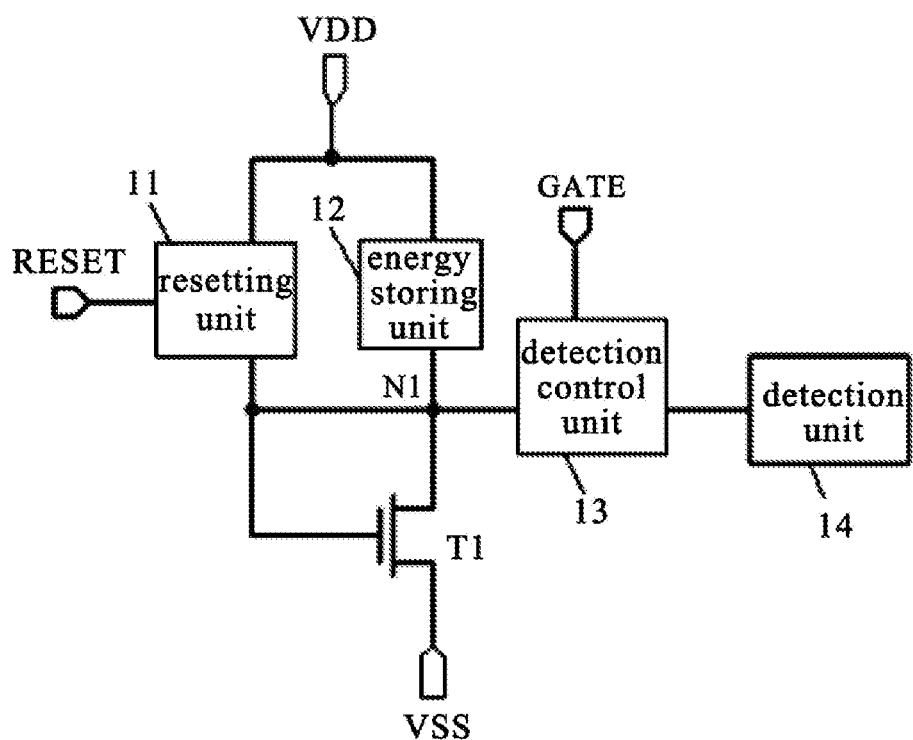
FIG. 2 is a structural diagram of an optical detection circuit according to at least one embodiment of the present disclosure.

Reference can be made to FIG. 2, which is a structural diagram of an optical detection circuit according to at least one embodiment of the present disclosure. The optical detection circuit shown in FIG. 2 differs from that shown in FIG. 1 in that, the gate electrode of the photosensitive transistor T1 is connected to the first node N1, the second voltage input terminal is a high voltage input terminal used to input a high voltage VDD, and the first voltage input terminal is a low voltage input terminal used to input a low voltage VSS.

In an embodiment, the gate control terminal is connected to the first node N1, and the photosensitive transistor T1 is an n-type transistor. In practical, the photosensitive transistor may be replaced by a p-type transistor. The type of the photosensitive transistor is not limited herein.

A detection cycle when the optical detection circuit operates includes a resetting phase, a sensing phase and a detecting phase that are set successively. Working states of the optical detection circuit in respective phases are described as follows.

In the resetting phase, under control of the resetting control terminal RESET, the resetting unit 11 controls the first node N1 to be connected to the second voltage input terminal, to reset a voltage at the first node N1 to be the high voltage VDD. The resetting unit 11 resets the voltage at the first node N1 to be the high voltage VDD to turn on the photosensitive transistor T1. Under control of the detection control terminal GATE, the detection control unit 13 controls the first node N1 to be disconnected from the detection unit 14. A difference between VDD and VSS is larger than a threshold voltage of T1 to enable T1 to be turned on. For example, VDD may be equal to 5V, VSS may be equal to 0V, and the threshold voltage of T1 ranges from 0.2V to 2V to enable T1 to be turned on.

In the sensing phase, under control of the resetting control terminal RESET, the resetting unit 11 stops resetting the voltage at the first node N1, the photosensitive transistor T1 continues to be turned on, a first terminal of the energy storing unit 12 discharges to the low voltage input terminal inputted with the low voltage VSS via the photosensitive transistor T1 to gradually lower the voltage at N1 until the photosensitive transistor is turned off. Here, the voltage at the first node N1 changes to VSS+$V_{th}$, $V_{th}$ is the threshold voltage of the photosensitive transistor T1, the threshold voltage $V_{th}$ of T1 changes as the intensity of the optical signal changes, and the wavelength of the optical signal is within the preset wavelength range.

In the detecting phase, under control of the detection control terminal GATE, the detection control unit 13 controls the first node N1 to be connected to the detection unit 14, and the detection unit 14 detects an electric signal from the first node N1 and obtains the intensity of the optical signal based on the electric signal.

Specifically, the electric signal from the first node N1 may be an electric charge signal. In the detecting phase, the electric charge stored by the energy storing unit 12 flows toward the detection unit 14, a value of electric charge read by the detection unit 14 represents an optical intensity of the optical signal, and the wavelength of the optical signal is within the preset wavelength range.

In the optical detection circuit of FIG. 2, if T1 is replaced by a p-type transistor, the first voltage input terminal is used to input the high voltage VDD, the second voltage input terminal is used to input the low voltage VSS, and a difference between VDD and VSS is smaller than the threshold voltage of T1 (when T1 is the p-type transistor, the threshold voltage of T1 is negative) to enable T1 to be turned on in the resetting phase. For example, VDD may be equal to 5V, VSS may be equal to 0V, and the threshold voltage of T1 ranges from −2V to −0.2V, thereby enabling T1 to be turned on in the resetting phase.

Figure 3:
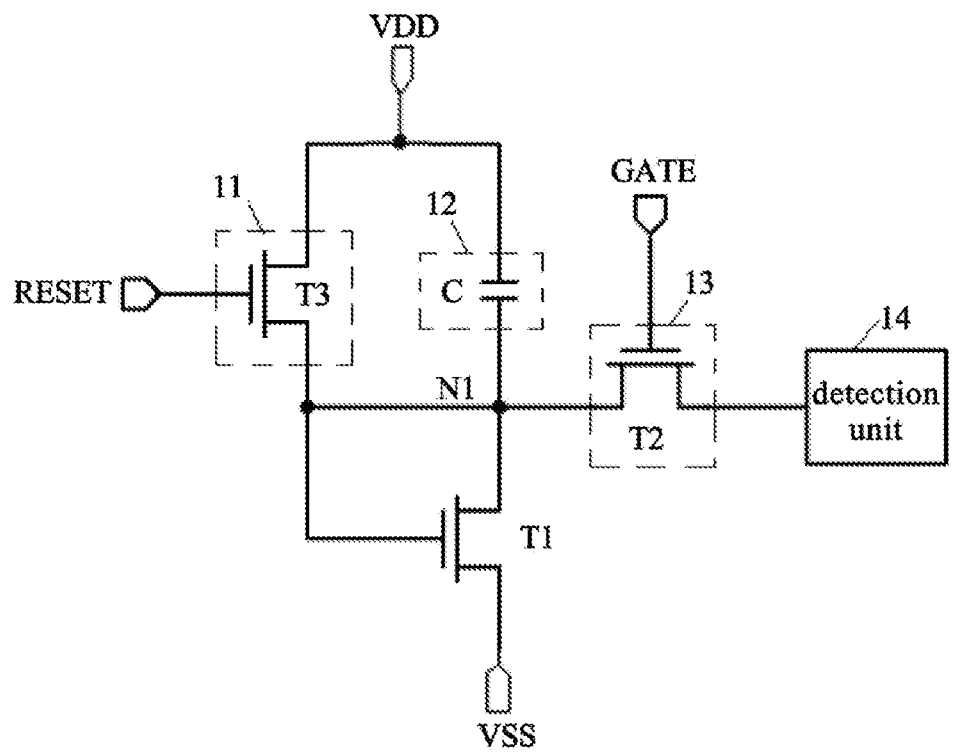
FIG. 3 is a circuit diagram of an optical detection circuit according to at least one embodiment of the present disclosure.

FIG. 3 is an exemplary circuit diagram of the optical detecting circuit shown in FIG. 2. As shown in FIG. 3, the resetting unit 11 includes a resetting transistor T3 having a gate electrode connected to the resetting control terminal RESET, a drain electrode connected to the first node N1, and a source electrode connected to the high voltage input terminal which inputs the high voltage VDD.

The energy storing unit 12 includes a storage capacitor C having a first terminal connected to the first node N1 and a second terminal connected to the high voltage input terminal which inputs the high voltage VDD.

The detection control unit 13 includes a detection control transistor T2 having a gate electrode connected to the detection control terminal GATE, a drain electrode connected to the first node N1 and a source electrode connected to the detection unit 14.

The detection unit 14 may a reading integrated circuit (IC).

In the optical detection circuit shown in FIG. 3, all transistors are n-type transistors, and other transistors in addition to T1 are common switching transistors that are not photosensitive. In practical, the transistors may be p-type transistors. Here the type of the transistors is not limited herein.

Figure 4:
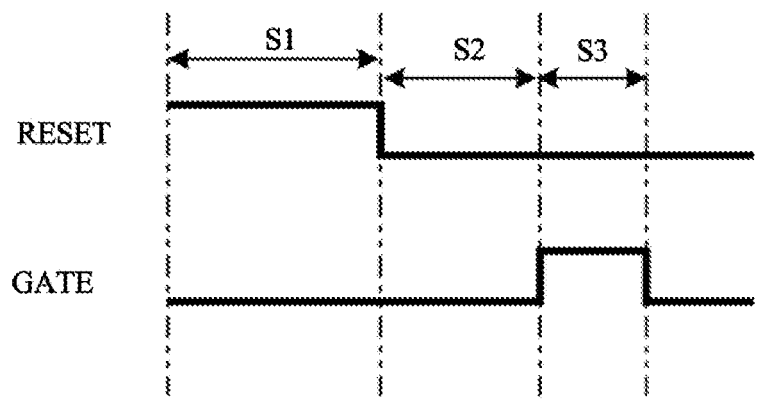
FIG. 4 is a working sequence diagram of an optical detection circuit according to at least one embodiment of the present disclosure.

FIG. 4 is a working sequence diagram of an optical detection circuit according to at least one embodiment of the present disclosure. As shown in FIG. 4, a detection cycle of the optical detection circuit includes a resetting phase S1, a sensing phase S2 and a detecting phase S3 that are successively arranged. As shown in FIG. 3 and FIG. 4, working states of the optical detection circuit in respective phases are described as follows.

In the resetting phase S1, RESET outputs a high level, and T3 is turned on to control the first node N1 to be connected to the high voltage VDD, thereby resetting a voltage at the first node N1 to be the high voltage VDD and turning the photosensitive transistor T1 on. GATE outputs a low level, T2 is turned off to control the first node N1 to be disconnected from the detection unit 14.

In the sensing phase S2, RESET outputs a low level, T3 is turned off, and the resetting unit 11 stops resetting the voltage at the first node N1. The photosensitive transistor T1 continues to be turned on, and a first terminal of the storage capacitor C discharges to the first voltage input terminal via the photosensitive transistor T1 to gradually lower the voltage at N1 until the photosensitive transistor is turned off. Here, the voltage at the first node N1 changes to VSS+$V_{th}$, $V_{th}$ is the threshold voltage of the photosensitive transistor T1, the threshold voltage $V_{th}$ of T1 changes as the intensity of the optical signal changes, and the wavelength of the optical signal is within the preset wavelength range.

In the detecting phase S3, GATE outputs a high level, and T2 is turned on to control the first node N1 to be connected to the detection unit 14. The detection unit 14 detects an electric charge signal from the first node N1 and obtains the intensity of the optical signal based on a value of electric charge corresponding to the electric charge signal.

In the detecting phase S3, electric charge stored by the storage capacitor C flows toward the detection unit 14, and a value of electric charge read by the detection unit 14 represents an optical intensity.

Figure 5:
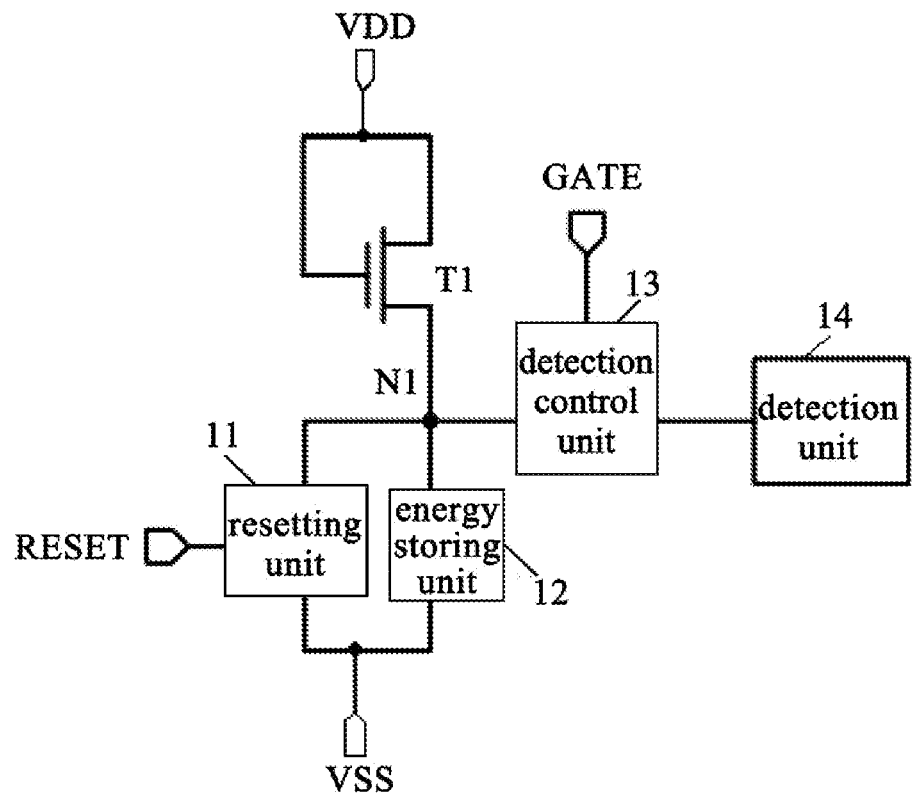
FIG. 5 is a structural diagram of an optical detection circuit according to at least one embodiment of the present disclosure.

Reference can be made to FIG. 5, which is a structural diagram of an optical detection circuit according to at least one embodiment of the present disclosure. The optical detection circuit shown in FIG. 5 differs from that shown in FIG. 1 in that, the gate electrode of the photosensitive transistor T1 is connected to the first voltage input terminal, the first voltage input terminal is a high voltage input terminal used to input the high voltage VDD, and the second voltage input terminal is a low voltage input terminal used to input the low voltage VSS.

In the embodiment of the present disclosure, the gate control terminal is connected to the first voltage input terminal, and the photosensitive transistor T1 is the n-type transistor. In practical, the photosensitive transistor may be replaced by the p-type transistor. The type of the photosensitive transistor is not limited herein.

A detection cycle when the optical detection circuit works includes a resetting phase, a sensing phase and a detecting phase that are successively arranged. Working states of the optical detection circuit in respective phases are described as follows.

In the resetting phase, under control of the resetting control terminal RESET, the resetting unit 11 controls the first node N1 to be connected to the second voltage input terminal to reset a voltage at the first node N1 to be the low voltage VSS. The resetting unit 11 resets the voltage at the first node N1 to be the low voltage VSS, and a difference between VDD and VSS is larger than a threshold voltage of T1 to enable the photosensitive transistor T1 to be turned on. Under control of the detection control terminal GATE, the detection control unit 13 controls the first node N1 to be disconnected from the detection unit 14, and a difference between VDD and VSS is larger than the threshold voltage of T1 to enable T1 to be turned on. For example, VDD may be equal to 3V, VSS may be equal to 0V, and the threshold voltage of T1 ranges from 0.1V to 1V to enable T1 to be turned on.

In the sensing phase, under control of the resetting control terminal RESET, the resetting unit 11 stops resetting the voltage at the first node N1, the photosensitive transistor T1 continues to be turned on, VDD charges the first terminal of the energy storing unit 12 to gradually increase the voltage at N1 until the photosensitive transistor T1 is turned off. Here, the voltage at the first node N1 changes to VDD-$V_{th}$, $V_{th}$ is the threshold voltage of the photosensitive transistor T1, the threshold voltage $V_{th}$ of T1 changes as the intensity of the optical signal changes, and the wavelength of the optical signal is within the preset wavelength range.

In the detecting phase, under control of the detection control terminal GATE, the detection control unit 13 controls the first node N1 to be connected to the detection unit 14, and the detection unit detects an electric signal from the first node N1 and obtains the intensity of the optical signal based on the electric signal.

In the optical detection circuit as shown in FIG. 5, if T1 is replaced by the p-type transistor, the first voltage input terminal may be used to input the low voltage VSS, the second voltage input terminal may be used to input the high voltage VDD, and a difference between VDD and VSS is smaller than the threshold voltage of T1 (when T1 is the p-type transistor, the threshold of T1 is negative) to enable T1 to be turned on in the resetting phase. For example, VDD may be equal to 3V, VSS may be equal to 0V, and the threshold voltage of T1 ranges from −1V to −0.1V to enable T1 to be turned on in the resetting phase.

Figure 6:
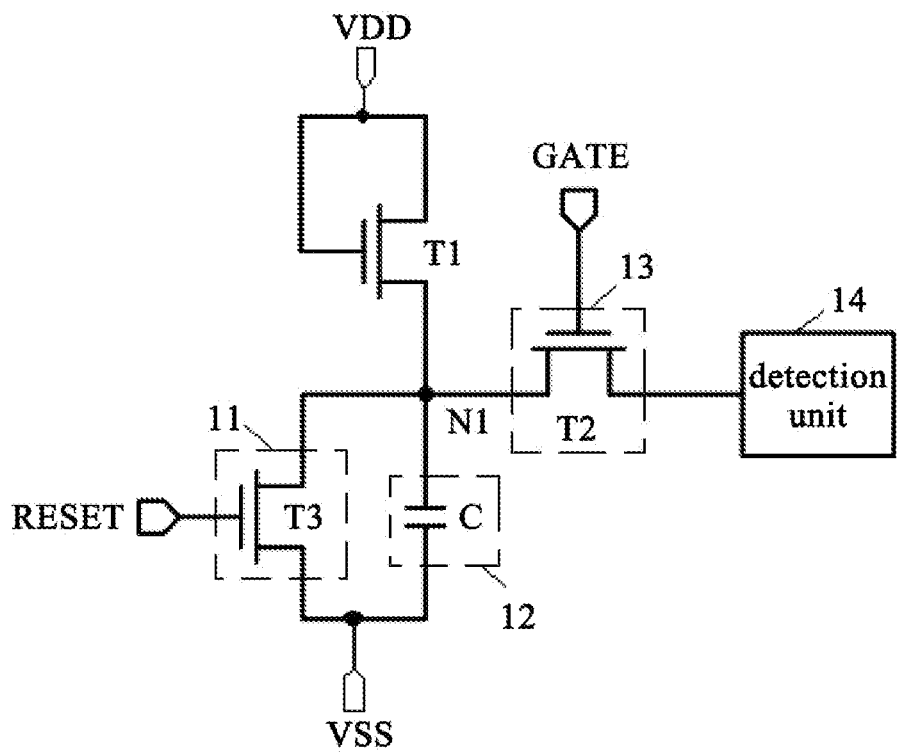
FIG. 6 is a circuit diagram of an optical detection circuit according to at least one embodiment of the present disclosure.

FIG. 6 is an exemplary circuit diagram of the optical detection circuit shown in FIG. 5. The resetting unit includes a resetting transistor T3 having a gate electrode connected to the resetting control terminal RESET, a drain electrode connected to the first node N1, and a source electrode connected to the low voltage input terminal which inputs the low voltage VSS.

The energy storing unit 12 includes a storage capacitor C having a first terminal connected to the first node N1 and a second terminal connected to the low voltage input terminal which inputs the low voltage VSS.

The detection control unit 13 includes a detection control transistor T2 having a gate electrode connected to the detection control terminal GATE, a drain electrode connected to the first node N1, and a source electrode connected to the detection unit 14.

The detection unit 14 may be arranged in a driving integrated circuit (IC).

As shown in FIG. 4, a detection cycle of the optical detection circuit includes a resetting phase S1, a sensing phase S2 and a detecting phase S3 that are successively arranged. As shown in FIG. 4 and FIG. 6, working states of the optical detection circuit in respective phases are described as follows.

In the resetting phase S1, RESET outputs a high level, and T3 is turned on to control the first node N1 to be connected to the low voltage input terminal which inputs the low voltage VSS, thereby resetting a voltage at the first node to be the low voltage VSS. A difference between VDD and VSS is larger than the threshold voltage of the photosensitive transistor T1 to enable the photosensitive transistor T1 to be turned on. GATE outputs a low level, T2 is turned off to control the first node N1 to be disconnected from the detection unit 14.

In the sensing phase S2, RESET outputs a low level, and T3 is turned off to stop resetting the voltage at the first node N1. The photosensitive transistor T1 continues to be turned on, the high voltage input terminal inputting the high voltage VDD charges a first terminal of the storage capacitor C to gradually increase the voltage at N1 until the photosensitive transistor T1 is turned off. Here, the voltage at the first node N1 changes to VDD-$V_{th}$, $V_{th}$ is the threshold voltage of the photosensitive transistor T1, the threshold voltage $V_{th}$ of T1 changes as the intensity of the optical signal changes, and the wavelength of the optical signal is within the preset wavelength range.

In the detecting phase S3, GATE outputs a high level, T2 is turned on to control the first node N1 to be connected to the detection unit 14. The detection unit 14 detects an electric charge signal from the first node N1 and obtains the intensity of the optical signal based on a value of electric charge corresponding to the electric charge signal.

In the detecting phase S3, electric charge stored by the storage capacitor C flows toward the detection unit 14, and the detection unit 14 reads different values of electric charge to represent optical intensities.

The present disclosure further provides an optical detection method according to at least one embodiment, which is applied to the above-described optical detection circuit. A detection cycle when the optical detection circuit works includes a resetting phase, a sensing phase and a detecting phase. The optical detection method includes:

in the resetting phase, resetting, by the resetting unit under control of the resetting control terminal, a voltage at the first node to turn on the photosensitive transistor, and controlling, by the detection control unit under control of the detection control terminal, the first node to be disconnected from the detection unit;

in the sensing phase, stopping resetting the voltage at the first node by the resetting unit under control of the resetting control terminal, and enabling, by the photosensitive transistor which continues to be turned on, the energy storing unit to charge or discharge until the photosensitive transistor is turned off; and in the detecting phase, controlling, by the detection control unit under control of the detection control terminal, the first node to be connected to the detection unit, detecting an electric signal from the first node by the detection unit, and obtaining an intensity of the optical signal based on the electric signal by the detection unit.

The optical detection method in the embodiment of the present disclosure uses the characteristic that the threshold voltage of the photosensitive transistor changes as the intensity of the optical signal received by the photosensitive transistor changes, and the intensity of the optical signal can be obtained based on the electric signal from the first node and detected by the detection unit, thereby achieving photoelectric conversion.

According to an optional implementation, the gate electrode of the photosensitive transistor is connected to the first node, and the second voltage is higher than the first voltage.

The step of resetting, by the resetting unit under the control of the resetting control terminal, the voltage at the first node includes: controlling, by the resetting unit under the control of the resetting control terminal, the first node to be connected to the second voltage input terminal to reset the voltage at the first node to be the second voltage.

The step of enabling, by the photosensitive transistor which continues to be turned on, the energy storing unit to charge or discharge until the photosensitive transistor is turned off includes: maintaining the photosensitive transistor to be turned on, and discharging, by the energy storing unit via the photosensitive transistor, until the photosensitive transistor is turned off to change the voltage at the first node into $V1+V_{th}$, where V1 is the first voltage input by the first voltage input terminal, and $V_{th}$ is a threshold voltage of the photosensitive transistor.

According to anther optional implementation, the gate electrode of the photosensitive transistor is connected to the first voltage input terminal, and the first voltage is higher than the second voltage.

The step of resetting, by the resetting unit under the control of the resetting control terminal, the voltage at the first node includes: controlling, by the resetting unit under the control of the resetting control terminal, the first node to be connected to the second voltage input terminal to reset the voltage at the first node to be the second voltage.

The step of enabling, by the photosensitive transistor which continues to be turned on, the energy storing unit to charge or discharge until the photosensitive transistor is turned off includes: enabling, by the photosensitive transistor which continues to be turned on, the energy storing unit to charge until the photosensitive transistor is turned off to change the voltage at the first node into $V1-V_{th}$, where V1 is the first voltage input by the first voltage input terminal, and $V_{th}$ is a threshold voltage of the photosensitive transistor.

Specifically, the step of detecting the electric signal from the first node by the detection unit and obtaining the intensity of the optical signal based on the electric signal by the detection unit includes: detecting, by the detection unit, a value of electric charge stored in the energy storing unit, and obtaining, by the detection unit, the intensity of the optical signal based on the value of the electric charge.

The present disclosure further provides an optical detection device according to an embodiment. The optical detection device includes multiple optical detection circuits as described above, where the multiple optical detection circuits are arranged in an array. The optical detection device further includes a photosensitive array which can convert an optical signal into an electric signal. A wavelength of the optical signal is within a preset wavelength range. The photosensitive array can achieve photoelectric conversion and may be applied in a photoelectric converter. The optical signal may be an infrared light, and functions related to infrared identification may be achieved. Optionally, the optical signal may be an ultraviolet light, and functions related to ultraviolet sensing may be achieved. The optical detection device may be applied to various fields such as medical treatment, cellular phone and security payment.

In many of the embodiments of the present disclosure, the term "unit" is used to describe a number of circuits that may be implemented with discrete components, integrated circuits, processors programmed with appropriate firmware or software, or the like, and where appropriate, each of these structures for implementing the described functions of the disclosed units are within the scope of the present disclosure.

Optional implementations of the present disclosure are given as above. It should be noted that various improvements and modifications can be made by the ordinary skilled in the art without departing from the principle of the present disclosure, and these improvements and modifications fall within the protection scope of the present disclosure.

What is claimed is:

1. An optical detection circuit, comprising a photosensitive transistor, a resetting unit, an energy storing unit, a detection control unit and a detection unit, wherein:

a first electrode and a gate electrode of the photosensitive transistor are connected to a first node, a second electrode of the photosensitive transistor is connected to a first voltage input terminal, a threshold voltage of the photosensitive transistor changes as an intensity of an optical signal received by the photosensitive transistor changes, a wavelength of the optical signal is within a preset wavelength range, and the first voltage input terminal is configured to input a first voltage;

the resetting unit comprises a resetting transistor having a gate electrode connected to a resetting control terminal, a drain electrode connected to the first node, and a source electrode connected to a second voltage input terminal inputs a second voltage;

the energy storing unit comprises a storage capacitor having a first terminal connected to the first node and a second terminal connected to the second voltage input terminal;

the detection control unit comprises a detection control transistor having a gate electrode connected to a detection control terminal, a drain electrode connected to the first node and a source electrode connected to the detection unit; and the detection unit is configured to, in a case that the detection control unit controls the first node to be connected to the detection unit, detect an electric signal from the first node and obtain the intensity of the optical signal based on the electric signal.

2. The optical detection circuit according to claim 1, wherein the photosensitive transistor comprises a channel layer, and a photosensitive material layer is arranged on a surface of the channel layer; and when the photosensitive transistor is turned on, a source-drain current flowing through the channel layer changes as an intensity of an optical signal received by the photosensitive material layer changes.

3. The optical detection circuit according to claim 1, wherein the photosensitive transistor is an n-type transistor, and the second voltage is higher than the first voltage; or the photosensitive transistor is a p-type transistor, and the second voltage is lower than the first voltage.

4. The optical detection circuit according to claim 1, wherein the detection unit is configured to, when the detection control unit controls the first node to be connected to the detection unit, detect a value of electric charge stored by the energy storing unit, and obtain the intensity of the optical signal based on the value of the electric charge.

5. The optical detection circuit according to claim 3, wherein:

the photosensitive transistor is the p-type transistor, and a difference between the first voltage and the second voltage is larger than the threshold voltage of the photosensitive transistor; or the photosensitive transistor is the n-type transistor, and a difference between the first voltage and the second voltage is smaller than the threshold voltage of the photosensitive transistor.

6. The optical detection circuit according to claim 1, wherein a detection cycle of the optical detection circuit comprises a resetting phase, a sensing phase and a detecting phase that are set successively, and all transistors in the optical detection circuit are p-type transistors;

the resetting control terminal outputs a high level in the resetting phase and outputs low levels in the sensing phase and the detecting phase; and the detection control terminal outputs low levels in the resetting phase and the sensing phase and outputs a high level in the detecting phase.

7. An optical detection method, applied to the optical detection circuit according to claim 1, wherein a detection cycle of the optical detection circuit comprises a resetting phase, a sensing phase and a detecting phase, and the optical detection method comprises:

in the resetting phase, resetting, by the resetting unit under control of the resetting control terminal, a voltage at the first node to turn on the photosensitive transistor and controlling, by the detection control unit under control of the detection control terminal, the first node to be disconnected from the detection unit;

in the sensing phase, stopping resetting the voltage at the first node by the resetting unit under control of the resetting control terminal, and enabling, by the photosensitive transistor which continues to be turned on, the energy storing unit to charge or discharge until the photosensitive transistor is turned off; and in the detecting phase, controlling, by the detection control unit under control of the detection control terminal, the first node to be connected to the detection unit, detecting, by the detection unit, an electric signal from the first node, and obtaining, by the detection unit, an intensity of the optical signal based on the electric signal.

8. The optical detection method according to claim 7, wherein:

the step of resetting, by the resetting unit under the control of the resetting control terminal, the voltage at the first node comprises: controlling, by the resetting unit under the control of the resetting control terminal, the first node to be connected to the second voltage input terminal, to reset the voltage at the first node to be the second voltage; and the step of enabling, by the photosensitive transistor which continues to be turned on, the energy storing unit to charge or discharge until the photosensitive transistor is turned off comprises: maintaining the photosensitive transistor to be turned on, and discharging, by the energy storing unit via the photosensitive transistor, until the photosensitive transistor is turned off to change the voltage at the first node into V1+Vth, wherein V1 is the first voltage input by the first voltage input terminal, and Vth is the threshold voltage of the photosensitive transistor.

9. The optical detection method according to claim 7, wherein the step of detecting the electric signal from the first node by the detection unit and obtaining the intensity of the optical signal based on the electric signal by the detection unit comprises: detecting, by the detection unit, a value of electric charge stored in the energy storing unit; and obtaining, by the detection unit, the intensity of the optical signal based on the value of the electric charge.

10. The optical detection method according to claim 8, wherein:

the photosensitive transistor is a p-type transistor, and a difference between the first voltage and the second voltage is larger than the threshold voltage of the photosensitive transistor; or the photosensitive transistor is an n-type transistor, and a difference between the first voltage and the second voltage is smaller than the threshold voltage of the photosensitive transistor.

11. The optical detection method according to claim 7, wherein all transistors in the optical detection circuit are p-type transistors; and wherein:

the resetting control terminal outputs a high level in the resetting phase and outputs low levels in the sensing phase and the detecting phase; and the detection control terminal outputs low levels in the resetting phase and the sensing phase and outputs a high level in the detecting phase.

12. An optical detection device, comprising a plurality of the optical detection circuits according to claim 1, wherein the plurality of the optical detection circuits is arranged in an array.

13. An optical detection circuit, comprising a photosensitive transistor, a resetting unit, an energy storing unit, a detection control unit and a detection unit, wherein:

a first electrode of the photosensitive transistor is connected to a first node, a second electrode and a gate electrode of the photosensitive transistor is connected to a first voltage input terminal, a threshold voltage of the photosensitive transistor changes as an intensity of an optical signal received by the photosensitive transistor changes, a wavelength of the optical signal is within a preset wavelength range, and the first voltage input terminal is configured to input a first voltage;

the resetting unit comprises a resetting transistor having a gate electrode connected to a resetting control terminal, a drain electrode connected to the first node, and a source electrode connected to a second voltage input terminal which inputs a second voltage;

the energy storing unit comprises a storage capacitor having a first terminal connected to the first node and a second terminal connected to the second voltage input terminal;

the detection control unit comprises a detection control transistor having a gate electrode connected to a detection control terminal, a drain electrode connected to the first node and a source electrode connected to the detection unit; and the detection unit is configured to, in a case that the detection control unit controls the first node to be connected to the detection unit, detect an electric signal from the first node and obtain the intensity of the optical signal based on the electric signal.

14. The optical detection circuit according to claim 13, wherein the photosensitive transistor comprises a channel layer, and a photosensitive material layer is arranged on a surface of the channel layer; and when the photosensitive transistor is turned on, a source-drain current flowing through the channel layer changes as an intensity of an optical signal received by the photosensitive material layer changes.

15. The optical detection circuit according to claim 13, wherein:
the photosensitive transistor is an n-type transistor, and the first voltage is higher than the second voltage; or
the photosensitive transistor is a p-type transistor, and the first voltage is lower than the second voltage.

16. The optical detection circuit according to claim 13, wherein the detection unit is configured to, when the detection control unit controls the first node to be connected to the detection unit, detect a value of electric charge stored by the energy storing unit, and obtain the intensity of the optical signal based on the value of the electric charge.

17. An optical detection method, applied to the optical detection circuit according to claim 13, wherein a detection cycle of the optical detection circuit comprises a resetting phase, a sensing phase and a detecting phase, and the optical detection method comprises:
in the resetting phase, resetting, by the resetting unit under control of the resetting control terminal, a voltage at the first node to turn on the photosensitive transistor and controlling, by the detection control unit under control of the detection control terminal, the first node to be disconnected from the detection unit;
in the sensing phase, stopping resetting the voltage at the first node by the resetting unit under control of the resetting control terminal, and enabling, by the photosensitive transistor which continues to be turned on, the energy storing unit to charge or discharge until the photosensitive transistor is turned off; and
in the detecting phase, controlling, by the detection control unit under control of the detection control terminal, the first node to be connected to the detection unit, detecting, by the detection unit, an electric signal from the first node, and obtaining, by the detection unit, an intensity of the optical signal based on the electric signal.

18. The optical detection method according to claim 17, wherein:
the step of resetting, by the resetting unit under the control of the resetting control terminal, the voltage at the first node comprises: controlling, by the resetting unit under the control of the resetting control terminal, the first node to be connected to the second voltage input terminal, to reset the voltage at the first node to be the second voltage; and
the step of enabling, by the photosensitive transistor which continues to be turned on, the energy storing unit to charge or discharge until the photosensitive transistor is turned off comprises: enabling, by the photosensitive transistor which continues to be turned on, the energy storing unit to charge until the photosensitive transistor is turned off to change the voltage at the first node into V1−Vth, wherein V1 is the first voltage input by the first voltage input terminal, and Vth is the threshold voltage of the photosensitive transistor.

19. The optical detection method according to claim 17, wherein the step of detecting the electric signal from the first node by the detection unit and obtaining the intensity of the optical signal based on the electric signal by the detection unit comprises: detecting, by the detection unit, a value of electric charge stored in the energy storing unit; and obtaining, by the detection unit, the intensity of the optical signal based on the value of the electric charge.

20. The optical detection method according to claim 18, wherein:
the photosensitive transistor is a p-type transistor, and a difference between the first voltage and the second voltage is larger than the threshold voltage of the photosensitive transistor; or
the photosensitive transistor is an n-type transistor, and a difference between the first voltage and the second voltage is smaller than the threshold voltage of the photosensitive transistor.

* * * * *